United States Patent
Schloesser et al.

(10) Patent No.: US 9,349,842 B2
(45) Date of Patent: May 24, 2016

(54) METHODS OF FORMING SEMICONDUCTOR DEVICES COMPRISING FERROELECTRIC ELEMENTS AND FAST HIGH-K METAL GATE TRANSISTORS

(71) Applicant: GLOBALFOUNDRIES Inc., Grand Cayman (KY)

(72) Inventors: Till Schloesser, Dresden (DE); Peter Baars, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 283 days.

(21) Appl. No.: 13/793,645

(22) Filed: Mar. 11, 2013

(65) Prior Publication Data

US 2013/0270619 A1   Oct. 17, 2013

(51) Int. Cl.
| H01L 29/66 | (2006.01) |
| H01L 21/28 | (2006.01) |
| H01L 29/51 | (2006.01) |
| H01L 27/115 | (2006.01) |
| H01L 29/78 | (2006.01) |
| H01L 21/8234 | (2006.01) |

(52) U.S. Cl.
CPC ...... *H01L 29/6684* (2013.01); *H01L 21/28291* (2013.01); *H01L 27/11509* (2013.01); *H01L 29/516* (2013.01); *H01L 29/78391* (2014.09); *H01L 21/823462* (2013.01)

(58) Field of Classification Search
CPC ............ H01L 29/516; H01L 29/6684; H01L 27/11509; H01L 21/28291; H01L 21/823462; H01L 29/78391
See application file for complete search history.

(56) References Cited

U.S. PATENT DOCUMENTS

| 6,563,183 | B1 | 5/2003 | En et al. ........................ 257/410 |
| 7,635,634 | B2 * | 12/2009 | Stapelmann ...... H01L 21/28194 |
| | | | 257/E21.001 |
| 8,252,675 | B2 * | 8/2012 | Lee ................... H01L 21/28088 |
| | | | 257/E21.177 |
| 2005/0035345 | A1 | 2/2005 | Lin et al. .......................... 257/20 |
| 2005/0136632 | A1 * | 6/2005 | Rotondaro ........ H01L 21/28185 |
| | | | 438/591 |
| 2006/0107871 | A1 | 5/2006 | Baum et al. |
| 2006/0177997 | A1 | 8/2006 | Lin et al. |

(Continued)

FOREIGN PATENT DOCUMENTS

| CN | 1992273 A | 7/2007 |
| JP | 2003002650 A | 8/2003 |

(Continued)

OTHER PUBLICATIONS

Office Action dated Apr. 23, 2015 from Taiwan Intellectual Property Office for counterpart TW Patent Application No. 102105958.

(Continued)

*Primary Examiner* — Evan Pert
*Assistant Examiner* — Damon Hillman
(74) *Attorney, Agent, or Firm* — Amerson Law Firm, PLLC

(57) ABSTRACT

Ferroelectric circuit elements, such as field effect transistors or capacitors, may be formed on the basis of hafnium oxide, which may also be used during the fabrication of sophisticated high-k metal gate electrode structures of fast transistors. To this end, the hafnium-based oxide having appropriate thickness and material composition may be patterned at any appropriate manufacturing stage, without unduly affecting the overall process flow for fabricating a sophisticated high-k metal gate electrode structure.

35 Claims, 5 Drawing Sheets

(56) References Cited

U.S. PATENT DOCUMENTS

| | | | |
|---|---|---|---|
| 2007/0148838 A1 | 6/2007 | Doris et al. | 438/197 |
| 2007/0228432 A1 | 10/2007 | Ishihara et al. | |
| 2008/0272437 A1 | 11/2008 | Doris et al. | 257/369 |
| 2009/0184376 A1 | 7/2009 | Cho et al. | 257/369 |
| 2009/0261395 A1 | 10/2009 | Boescke | |
| 2012/0049288 A1 | 3/2012 | Maruyama et al. | |
| 2012/0193727 A1 | 8/2012 | Carter et al. | 257/392 |

FOREIGN PATENT DOCUMENTS

| | | |
|---|---|---|
| KR | 10-0520633 | 10/2005 |
| KR | 10-2007-0076433 | 7/2007 |
| KR | 10-2010-0081982 | 7/2010 |
| TW | 200407986 | 5/2004 |
| TW | 200520237 | 6/2005 |
| TW | 200943438 A1 | 10/2009 |
| TW | 201115649 A1 | 5/2011 |
| TW | 201135927 A1 | 10/2011 |

OTHER PUBLICATIONS

Office Action dated Apr. 21, 2015 from Chinese Intellectual Property Office for counterpart Chinese Patent Application No. 201310126397.4.
Office Action dated Jun. 25, 2014, issued by Korean Intellectual Property Office for Korean Application No. 10-2013-0039993.
Boescke et al., "Ferroelectricity in Hafnium Oxide: CMOS compatible Ferroelectric Field Effect Transistors," IEDM11-547-550, 2011 IEEE.
Translation of Official Communication from German Patent Application No. 10 2012 205 966.6 dated Nov. 9, 2012.
Reinhardt and Reidy, Handbook of Cleaning for Semiconductor Manufacturing, Scrivener Publishing, pp. 239-284, 2011.

* cited by examiner

METHODS OF FORMING SEMICONDUCTOR DEVICES COMPRISING FERROELECTRIC ELEMENTS AND FAST HIGH-K METAL GATE TRANSISTORS

BACKGROUND OF THE INVENTION

1. Field of the Invention

Generally, the present disclosure relates to the field of integrated circuits, and, more particularly, to semiconductors including field effect transistors and non-volatile information storage areas.

2. Description of the Related Art

Integrated circuits typically comprise a very large number of circuit elements on a given chip area according to a specified circuit layout, wherein advanced devices may comprise millions of signal nodes that may be formed by using field effect transistors, which may also be referred to herein as MOS transistors. Thus, field effect transistors may represent a dominant component of modern semiconductor products, wherein advances towards increased performance and low integration volume are mainly associated with a reduction of size of the basic transistor structures. Generally, a plurality of process technologies are practiced, wherein, for complex circuitry, such as microprocessors, storage chips, ASICs (application specific ICs) and the like, MOS technology is currently one of the most promising approaches due to the superior characteristics in view of operating speed and/or power consumption and/or cost efficiency. During the fabrication of complex integrated circuits using MOS technology, millions of field effect transistors, i.e., N-channel transistors and/or P-channel transistors, are formed on a substrate including a crystalline semiconductor layer. A MOS transistor, irrespective of whether an N-channel transistor or a P-channel transistor is considered, comprises so-called PN junctions represented by an interface formed of highly doped drain and source regions and an inversely or weakly doped channel region disposed between the drain region and the source region. The conductivity of the channel region, i.e., the drive current capability of the conductive channel, is controlled by a gate electrode formed adjacent to the channel region and separated therefrom by a thin insulating layer.

Due to the reduced dimensions of circuit elements, not only performance of the individual transistor elements may be increased, but also their packing density may be improved, thereby providing the potential for incorporating increased functionality into a given chip area. For this reason, highly complex circuits have been developed, which may include different types of circuits, such as analog circuits, digital circuits and the like, thereby providing entire systems on a single chip (SoC). Furthermore, in sophisticated microcontroller devices and other complex circuits, an increasing amount of storage capacity may be provided on chip, thereby also significantly enhancing the overall performance of complex electronic systems. Similarly, in many types of control circuits, different types of storage devices may be incorporated so as to provide an acceptable compromise between die area consumption and information storage density on the one side versus operating speed on the other side. For instance, fast or temporary buffer memories, so-called cache memories, may be provided in the vicinity of the CPU core, wherein respective cache memories may be designed so as to allow reduced access times compared to external storage devices.

On the other hand, increasingly, non-volatile memories may have to be incorporated in sophisticated semiconductor devices, wherein the flash memory technique represents one promising technology, in which MOS technology may be efficiently applied to forming storage cells. To this end, basically a field effect transistor is provided, in which transistor operation is controlled, on the other hand, by a gate electrode, as discussed above, which additionally includes a "floating" gate that is electrically insulated from the control gate electrode and from the channel region and drain region of the field effect transistor. The floating gate represents a dielectric charge storage region within the control gate electrode of the field effect transistor and may hold "stationary" charge carriers, which in turn influence the current flow behavior of the field effect transistor. The stationary charge carriers in the floating gate may be injected upon establishing a specific operation mode, which is also referred to as programming of the memory cell, in which any type of leakage current generating mechanism may be taken advantage of so as to result in the incorporation of charge carriers in the charge storage region. Consequently, in the normal operation mode, the injected charge carriers in the charge storage region may thus significantly affect the current flow through the channel region of the transistor, which may be detected by an appropriate control circuitry. On the other hand, upon "erasing" the memory cell, the charge carriers in the charge storage region may be removed, for instance by establishing appropriate voltage conditions, thereby establishing a detectable different operational behavior of the field effect transistor during the normal operation mode, i.e., during the operation with the standard supply voltages. Although the concept of flash memory cells, i.e., of field effect transistors comprising a floating gate, provides a non-volatile storage mechanism with moderately high information density and short access times, it turns out that still significant drawbacks, such as relatively long write times and complex erase cycles, in combination with reduced durability of the storage mechanism, may render this approach less attractive, in particular in combination with fast logic circuit elements, such as sophisticated high-k metal gate based transistors.

In addition to flash memory devices, other concepts have been the subject of intensive investigations in order to provide non-volatile memory devices. In this respect, ferroelectric materials have been investigated, since ferroelectricity may generally represent a very attractive concept for implementing a non-volatile memory. For example, highly efficient capacitors may be formed on the basis of a ferroelectric dielectric material, wherein the polarization state of the ferroelectric material may be adjusted on the basis of appropriate electrical fields applied to the ferroelectric material in order to "program" the capacitor. Since the polarization state may be preserved unless a corresponding high electrical field or a high temperature is applied, the information reflected by the polarization state may thus be preserved upon switching off the supply power for the capacitor. Hence, contrary to conventional storage capacitors, a refreshment of the state of the capacitor is not required. Therefore, a capacitor formed on the basis of a ferroelectric dielectric material may not only provide a non-volatile device, but also superior performance compared to conventional capacitors.

Moreover, with respect to further reducing the required chip area, a field effect transistor may be formed on the basis of a ferroelectric gate dielectric material, thereby achieving stable transistor states upon appropriately adjusting the polarization of the ferroelectric gate dielectric material. That is, depending on the polarization state, significantly different drive current/gate voltage characteristics are obtained, which may thus be used for defining different logic state. Also in this case, the polarization state is stable, unless a sufficiently high voltage and/or a high temperature is applied, so that the field effect transistor itself may be used as a non-volatile memory cell.

Although a ferroelectric field effect transistor or a ferroelectric capacitor represents a very promising concept for a non-volatile storage device, it has proven to be a difficult task to identify appropriate ferroelectric materials, in particular when ferroelectric components, such as ferroelectric field effect transistors, are to be combined with sophisticated transistor structures as are typically used in complex logic circuitry. Recent research results, however, indicate that hafnium oxide-based dielectric materials may represent promising candidates for materials providing ferroelectric behavior. For example, in Boescke et al., "Ferroelectricity in Hafnium Oxide: CMOS compatible Ferroelectric Field Effect Transistors," IEDM 2011 (the entire disclosure of which is incorporated herein by reference), silicon dioxide doped hafnium oxide has been identified as a material, for which an appropriate crystalline state may be established that provides the ferroelectric behavior. Consequently, circuit elements, such as field effect transistors, capacitors and the like, may be formed on the basis of silicon dioxide doped hafnium oxide in order to provide superior functionality of complex integrated circuits, for instance with respect to exploiting the ferroelectric behavior so as to form a non-volatile storage element. On the other hand, the above-identified document does not relate to process techniques and semiconductor devices, in which sophisticated transistors as are typically used for logic circuitry may be provided in combination with ferroelectric circuit elements.

In view of the situation described above, the present disclosure relates to manufacturing techniques and semiconductor devices including ferroelectric circuit elements, in particular ferroelectric field effect transistors, while avoiding or at least reducing the effect of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides manufacturing techniques and semiconductor devices in which the dielectric circuit elements may be formed on the basis of an efficient manufacturing flow, in combination with sophisticated transistor devices, which may comprise high-k metal gate electrode structures and which may, therefore, be usable in signal parts requiring superior transistor characteristics, for instance in terms of switching speed, current drive capability and the like. To this end, in some illustrative embodiments, the high-k dielectric material of the gate electrode structure of the sophisticated transistors may be formed on the basis of a dielectric material having incorporated therein hafnium, while a dielectric material of the ferroelectric circuit element may also be formed on the basis of hafnium, however, without interfering with the characteristics of the gate dielectric layer of the sophisticated transistors. In some illustrative embodiments, the ferroelectric circuit element may be provided in the form of a non-volatile storage device, such as a capacitor or a ferroelectric field effect transistor. In this manner, non-volatile memory areas may be incorporated into complex integrated circuits on the basis of the manufacturing process that is highly compatible with the process flow for forming sophisticated field effect transistors required for superior operation characteristics of logic circuitry or any other integrated circuits that require superior transistor characteristics. Hence, according to the principles disclosed herein, the electronic characteristics of a sophisticated gate electrode structure and the characteristics of the dielectric layer, such as a ferroelectric gate dielectric layer of a transistor, may be adjusted without undue additional process complexity and substantially without affecting the process flow and the finally achieved characteristics of sophisticated high-k metal gate electrode structures.

One illustrative semiconductor device disclosed herein comprises a first circuit element comprising a first electrode structure including a first high-k dielectric layer, wherein the first high-k dielectric layer comprises hafnium and has a first thickness. The semiconductor device further comprises a second circuit element comprising a second electrode structure including a second high-k dielectric layer having a ferroelectric behavior, wherein the second high-k dielectric layer has a second thickness and comprises hafnium and wherein the second thickness is greater than the first thickness.

One illustrative method disclosed herein comprises forming a high-k dielectric layer above a first active region and a second active region so as to serve as a ferroelectric layer. The method further comprises removing the high-k dielectric layer from above the first active region and preserving the high-k dielectric layer above the second active region. Additionally, the method comprises forming a first electrode structure above the first active region and a second electrode structure above the second active region.

A further illustrative method disclosed herein comprises forming a first gate electrode structure above a first active region, and the first gate electrode structure comprises a first hafnium-based dielectric material of a first thickness. The method further comprises forming a second gate electrode structure above a second active region, wherein the second gate electrode structure comprises a second hafnium-based dielectric material having a ferroelectric behavior and wherein the second hafnium-based dielectric material has a second thickness that is greater than the first thickness. Additionally, the method comprises forming drain and source regions in the first and second active regions.

BRIEF DESCRIPTION OF THE DRAWINGS

The disclosure may be understood by reference to the following description taken in conjunction with the accompanying drawings, in which like reference numerals identify like elements, and in which.

Figure 1A:
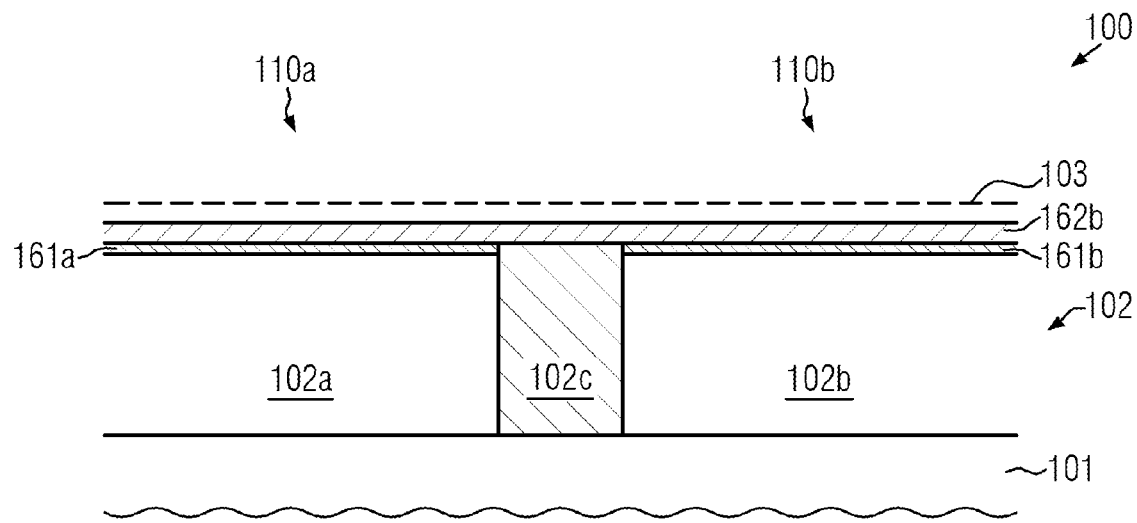
FIGS. 1*a*-1*h* schematically illustrate cross-sectional views of a semiconductor device during various manufacturing stages in forming sophisticated transistors in combination with a ferroelectric circuit element, such as a field effect transistor usable as a non-volatile storage device, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally provides manufacturing techniques and semiconductor devices in which hafnium-based high-k dielectric materials may be used for forming sophisticated circuit elements in the form of fast transistors, which provide the required performance characteristics for sophisticated applications, such as logic circuitry, while this material may also be used for implementing a ferroelectric behavior for other circuit elements, such as field effect transistors or capacitors, which, due to the ferroelectric behavior, may be used as non-volatile storage devices.

As is well known, hafnium oxide-based dielectric materials may be used in complex manufacturing strategies for providing a high-k dielectric layer into gate electrode structures, which may exhibit superior temperature stability, thereby enabling the adjustment of required electronic characteristics of sophisticated gate electrode structures. According to the most recent research results, as indicated above, hafnium oxide-based materials, which may include a certain fraction of silicon dioxide, exhibit a ferroelectric behavior, which in turn may be exploited in the form of a gate dielectric material of transistors and/or as a capacitor dielectric, wherein a polarization of the hafnium-based dielectric material may be adjusted by applying appropriate electrical fields. The adjusted polarization may then be preserved upon operating the circuit element, such as the transistor or the capacitor, with an operating voltage that does not exceed the critical electrical field as is required for changing the previously adjusted polarization. According to the principles disclosed herein, the hafnium-based dielectric material may be formed with appropriate material characteristics, i.e., with a required thickness, material composition and crystalline state, so as to exhibit the required ferroelectric behavior, while, on the other hand, well-established process techniques may be used without unduly interfering with other processes required for adjusting the characteristics of the hafnium-based dielectric materials for sophisticated gate electrode structures.

For example, hafnium oxide-based dielectric materials may be etched with high efficiency on the basis of a plurality of well-established wet chemical etch recipes or plasma-based etch techniques, when the hafnium oxide-based material is in a substantially amorphous state. Upon establishing a substantially amorphous state, a hafnium oxide-based dielectric material, whose characteristics in terms of layer thickness and material composition have been selected with respect to achieving the desired ferroelectric behavior, may be efficiently removed from other device areas without unduly affecting any underlying materials, such as the active region of sophisticated transistors. In this way, the ferroelectric material may be provided in a locally selective manner, while a hafnium-based dielectric material may be provided in other device areas so as to comply with the requirements of sophisticated transistors. Furthermore, in some illustrative embodiments, providing the ferroelectric material on the basis of hafnium with adjusted thickness and material composition may be integrated into a process flow for forming sophisticated gate electrode structures of fast transistors, wherein, in some cases, the gate electrode structures may be formed in an early manufacturing stage. That is, in this case, the final configuration and the electronic characteristics may be established upon patterning the gate electrode structures and prior to completing the basic transistor configuration.

In other illustrative embodiments, the final characteristics of the sophisticated gate electrode structures of fast transistors may be provided in a very advanced manufacturing stage, i.e., after completing the basic transistor configuration, by applying a so-called replacement gate approach. Also in this case, ferroelectric circuit elements, such as transistors and/or capacitors, may be provided without undue interference with the replacement gate approach.

FIG. 1a schematically illustrates a cross-sectional view of a semiconductor device 100 comprising a substrate 101, above which may be formed a semiconductor layer 102. The substrate 101 and the semiconductor layer 102 may form an SOI (semiconductor- or silicon-on-insulator) configuration, when a buried insulating layer (not shown) is formed below the semiconductor layer 102. On the other hand, in a bulk configuration, the semiconductor layer 102 may be in direct contact with a crystalline semiconductor material of the substrate 101. Furthermore, it should be appreciated that the semiconductor layer 102 may have formed therein a plurality of isolation structures 102c, which may appropriately laterally delineate various device regions in accordance with the overall layout of the device 100. For example, a first device region 110a may represent an area of the device 100 in which one or more sophisticated transistors may be formed, which may have appropriate characteristics so as to comply with the requirements for sophisticated applications, such as transistors from logic circuitry and the like. To this end, in the device region 110a, an active region 102a is provided as an example of a semiconductor region, in and above which at least one transistor is to be formed on the basis of a high-k metal gate electrode structure. It should be appreciated, however, that the device region 110a may comprise a plurality of active regions, in and above which corresponding P-channel transistors and/or N-channel transistors may be formed in accordance with the overall device requirements, for instance for implementing sophisticated signal paths and the like.

Similarly, a second device region 110b may be defined in its lateral size and shape by the isolation structure 102c, wherein, for convenience, also a single active region 102b is illustrated so as to represent an active region in and above which a ferroelectric circuit element is to be formed. In one illustrative embodiment, the corresponding ferroelectric circuit element may be provided in the form of a field effect transistor, as will be explained in more detail later on, while, in other cases, any other ferroelectric circuit element, for instance in the form of a capacitor, may be provided in and above the active region 102b.

Furthermore, in the manufacturing stage shown, a high-k dielectric layer 162b may be formed above the active regions 102a, 102b, wherein the dielectric layer 162b may comprise hafnium in the form of hafnium oxide with a certain fraction of silicon, thereby imparting the desired ferroelectric behavior to the layer 162b, when a desired crystalline state may be established during the further processing, for instance during any heat treatments and the like. For example, appropriate material characteristics for a hafnium oxide-based dielectric material are indicated in the above-identified document. For example, in some illustrative embodiments, the dielectric layer 162b may be provided with a thickness of 8 nm and higher, for instance 10 nm and more, wherein the contents of silicon in the layer 162b may be selected in accordance with the requirements for obtaining the desired ferroelectric behavior. Moreover, in some illustrative embodiments, the hafnium oxide-based dielectric layer 162b may be formed on an appropriate base layer or interface layer 161b, which may be comprised of any appropriate material, such as silicon dioxide, nitrogen and reached silicon dioxide, silicon nitride and the like. It should be appreciated that the characteristics of the base layer 161b may be selected so as to comply with the requirements of a ferroelectric circuit element to be formed in and above the active region 102b. For example, if a ferroelectric transistor is to be formed, the base layer 161b may have appropriate characteristics so as to obtain the overall electronic behavior, for instance in terms of threshold voltage, work function and the like, in combination with the hafnium-based dielectric layer 162b and possibly in combination with other material layers to be formed above the layer 162b in a later manufacturing stage.

Moreover, in some illustrative embodiments, a hard mask layer 103, for instance provided in the form of silicon nitride and the like, may be formed above the dielectric layer 162b, when a subsequent patterning of the layer on the basis of a resist material is considered inappropriate.

The semiconductor device 100 as shown in FIG. 1a may be formed on the basis of the following processes.

The isolation structure 102c may be formed on the basis of well-established lithography, etch, deposition, anneal and planarization techniques in order to provide a shallow trench isolation region in order to define the lateral size and shape of the device regions 110a, 110b. Furthermore, on a finer scaling, the isolation structure 102c may also define the lateral size and position of the corresponding active regions 102a, 102b, wherein it should be appreciated that the device regions 110a, 110b, and thus the active regions 102a, 102b, may not necessarily be adjacent regions as shown in FIG. 1a, but may be separated by any intermediate other active or isolation regions (not shown). Prior to or after forming the isolation structure 102c, the overall electronic conditions in the active regions 102a, 102b may be established, for instance, by implanting respective dopant species using well-established masking regimes and implantation recipes. Next, the base layer 161b, if required, may be formed, for instance by oxidation, nitridation and the like, or by deposition techniques, depending on the desired material composition and characteristics. In this manner, the thickness of the base layer 161b and the material composition thereof may be adjusted on the basis of well-established process techniques so as to obtain the finally desired overall characteristics of an electrode structure to be formed above the active region 102b. Thereafter, the hafnium-based dielectric layer 162b may be formed by any appropriate deposition technique, such as atomic layer deposition on the basis of well-established precursor materials. It should be appreciated that the deposition of hafnium-based materials is a well-established process step when forming sophisticated high-k metal gate electrode structures. Furthermore, a desired contents of silicon may be incorporated during the deposition process, as is, for instance, also specified above, so as to prepare the dielectric layer 162b in view of obtaining ferroelectric characteristics, when a desired crystalline state is taken by the material of the layer 162b, for instance upon being subjected to high temperature treatments, as are typically required during the further manufacturing flow. It should be appreciated that, in some illustrative embodiments, the process conditions during the deposition of the layer 162b may be selected so as to obtain a substantially amorphous state of the material 162b, which may thus provide for the possibility of efficiently etching the material of the layer 162b on the basis of well-established wet chemical etch recipes and/or plasma-assisted etch processes.

Thereafter, the hard mask layer 103, if required, may be deposited by using any well-established deposition recipes. Also in this case, the thickness of the material 103 may be selected so as to obtain the desired etch resistivity in order to protect the layer 162b above the active region 102b.

Figure 1B:
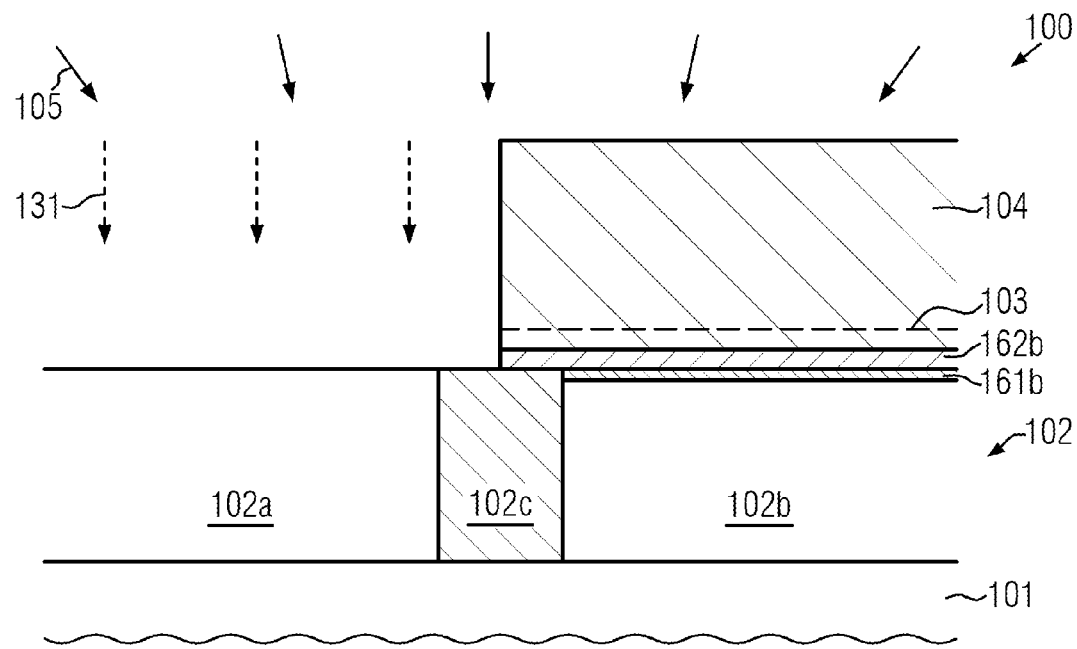

FIG. 1b schematically illustrates the semiconductor device 100 in a further advanced manufacturing stage, in which a mask 104, such as a resist mask, may be used during an etch process 105 so as to remove at least the layer 162b from above the device area 110a and thus from above the active region 102a. To this end, in some illustrative embodiments, the mask 104 may be used to pattern the hard mask material 103, which may then be used as a further etch mask during the process 105 so as to remove the material 162b. In other cases, as discussed above, the resist mask 104 may provide sufficient protection of the layer 162b. The etch process 105 for removing the material 162b may comprise an etch step performed on the basis of a wet chemical etch chemistry, such as hot phosphoric acid, hydrofluoric acid diluted in ethylene glycol (HFEG) or a mixture of hydrofluoric acid and hydrochloric acid (HF/HCl). In other cases, well-established plasma-assisted etch recipes may be applied, wherein any such recipes are also typically used when patterning high-k metal gate electrode structures. In some embodiments, as shown in FIG. 1b, the etch process 105 may comprise an additional etch step 131 so as to remove the base layer 161b from above the active region 102a, which may also be accomplished by using well-established wet chemical etch recipes, for instance for removing silicon dioxide, silicon nitride and the like. It should be appreciated that the base layer 161b may be used as an efficient etch stop material upon removing the exposed portion of the dielectric layer 162b, when a corresponding etch recipe is used that exhibits a pronounced etch selectivity with respect to the base layer 161b. In other illustrative embodiments (not shown), the base layer 161b may be removed after the etch process 105, for instance when removing the mask 104 and/or the hard mask 103, which may also be accomplished on the basis of any well-established etch recipes. For example, resist material may be efficiently removed by using wet chemical removal processes or plasma ash processes, while in the case of a hard mask material, any other wet chemical or plasma-assisted etch recipes may be applied. Consequently, the exposed portion of the dielectric layer 162b may be removed from above the active region 102a without unduly affecting the surface of the semiconductor material, which may thus be available for the formation of an appropriate dielectric material for a sophisticated gate electrode structure.

It should be appreciated that, at least during the etch step of the process 105, in which an exposed portion of the dielectric material 162b is removed, an amorphous state may be established, at least in the exposed portion of the material 162b, so as to enhance the efficiency of the applied etch chemistry. If in some illustrative embodiments it is considered appropriate to provide or treat the material 162b so as to be in a substantially crystalline state for achieving the ferroelectric characteristics, the crystalline structure may be significantly damaged and thus amorphized by applying an implantation process 131, during which an appropriate implant species, such as germanium and the like, may be used with appropriate energy and dose to prepare the exposed portion of the layer 162b for the subsequent removal process. It should be appreciated that appropriate process parameters for the process 131 may be readily determined on the basis of simulation and experiments for given material characteristics of the layer 162b in order to avoid undue penetration of the implant species into the active region 102a.

Figure 1C:
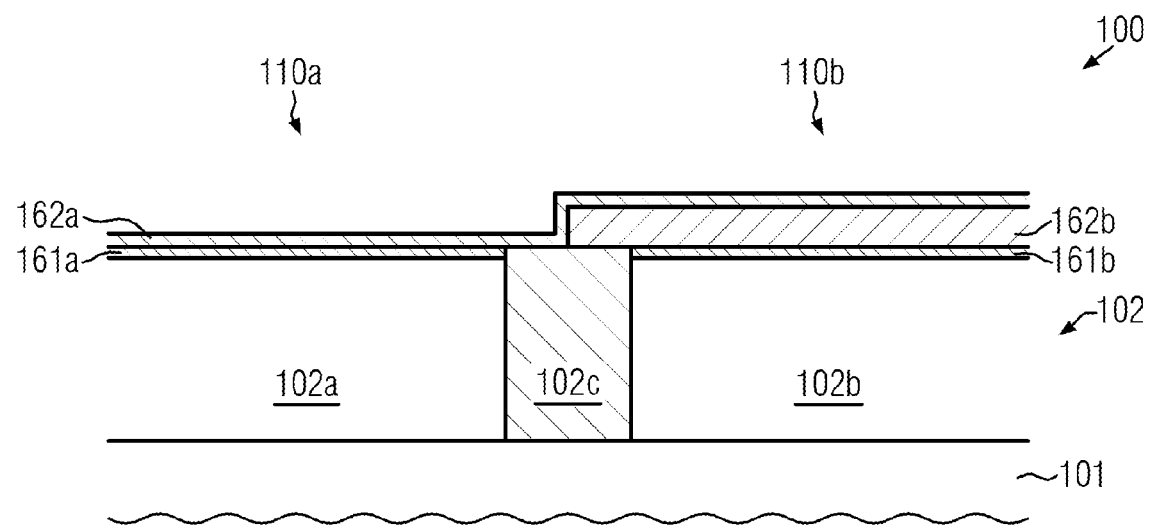

FIG. 1c schematically illustrates the semiconductor device 100 in a further advanced manufacturing stage, in which a high-k dielectric material 162a may be formed above the active region 102a and the active region 102b, wherein the material of the layer 162a may comprise a hafnium oxide-based material with characteristics so as to comply with the requirements of a sophisticated gate electrode structure to be formed above the active region 102a. For example, the layer 162a may be formed as a hafnium oxide material with an appropriate thickness of, for instance, 1-5 nm, depending on the requirements of the transistor still to be formed. In the embodiment shown in FIG. 1c, the dielectric layer 162a may be formed in combination with an appropriate base layer 161a, such as a silicon dioxide layer, a nitrogen-enriched silicon dioxide material and the like, in order to provide desired interface characteristics. Hence, the layers 161a and 162a may be provided with appropriate characteristics so as to comply with the requirements of sophisticated transistors, substantially without being affected by the presence of the layers 161b, 162b, which in turn are provided so as to obtain the desired ferroelectric behavior, as discussed above.

It should be appreciated that the dielectric layer 162a may comprise two or more different high-k dielectric materials, at least one of which may be provided in the form of a hafnium-based material. For example, a moderately thin hafnium dioxide material may be provided in combination with a further high-k dielectric component, wherein relevant electronic characteristics may be adjusted on the basis of the moderately thin hafnium dioxide material, for instance by incorporating appropriate work function metal species prior to depositing a further high-k dielectric material.

In some illustrative embodiments, at least the layer 162a may also be formed on the material 162b and may be preserved, at least partially, when forming an appropriate electrode structure above the active region 102b. On the other hand, the base layer 161a may be formed locally in the active region 102A, for instance by local oxidation, local nitrogen incorporation and the like. In other cases, the layers 162a, 161a may be patterned so as to remove a portion thereof from above the active region 102b, when the presence of any of these materials above the active region 102b is considered inappropriate. To this end, an appropriate masking regime may be applied in combination with etch chemistry, as is for instance also discussed above with reference to the patterning of the layer 162b. It should be appreciated, however, that typically the thickness of the layer 162a is significantly less compared to the thickness of the layer 162b, so that the layer 162a may act as an additional buffer layer, which may not unduly affect the overall dielectric characteristics of the layer 162b. Furthermore, since the material characteristics and the layer thickness of the layer 162a are known in advance, these characteristics may also be taken into consideration when adjusting appropriate material characteristics for the layer 162b so as to obtain, in combination, the desired ferroelectric behavior. It should be appreciated that the layers 161a, 162a may be formed on the basis of well-established process techniques.

Figure 1D:
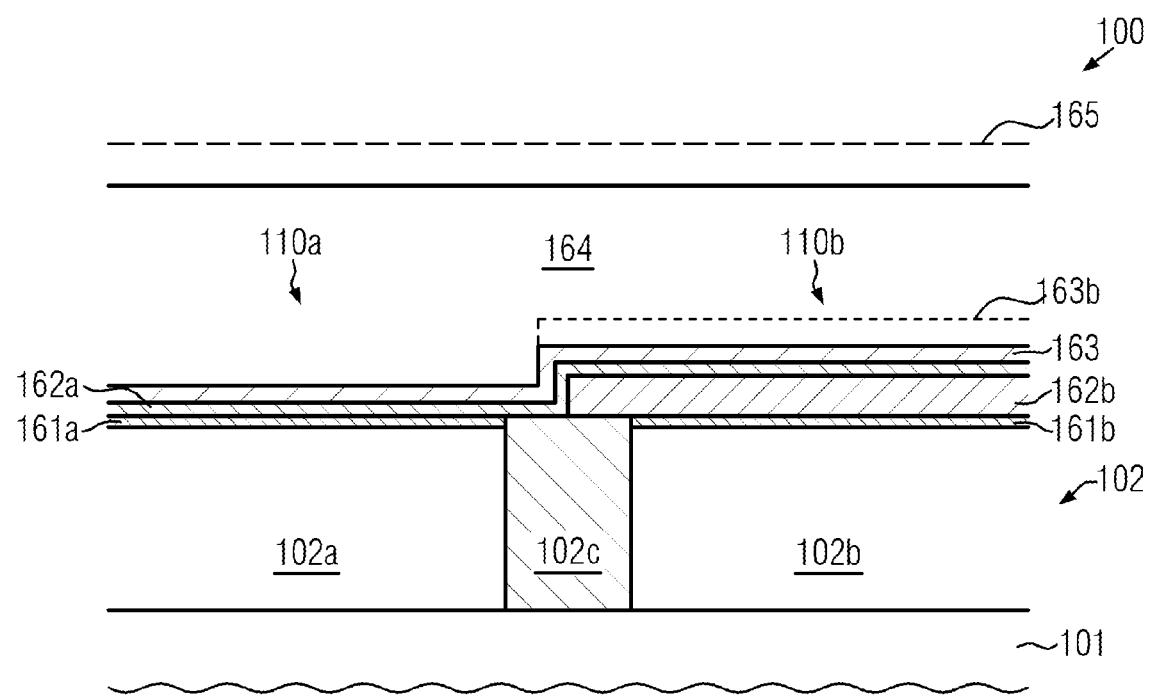

FIG. 1d schematically illustrates the semiconductor device 100 in a further advanced manufacturing stage showing a stack of material layers comprising the previously formed dielectric layers 162a, 162b, possibly in combination with the corresponding base layers 161a, 161b, and at least one metal-containing electrode material 163, for instance in the form of titanium nitride and the like. Furthermore, the layer stack may comprise a further electrode material 164, for instance in the form of a semiconductor material, such as polysilicon, silicon/germanium and the like. Additionally, one or more sacrificial layers 165, such as dielectric cap layers, in the form of silicon nitride, silicon dioxide and the like may be provided.

The at least one metal-containing electrode material 163 may be formed in compliance with any appropriate manufacturing strategy as required for adjusting the electronic characteristics of a sophisticated gate electrode structure to be formed above the active region 102a. For example, the material 163 may be provided so as to obtain a desired work function, which may be accomplished by depositing any appropriate work function metal species, which may be diffused into the underlying dielectric material 162a, followed by the removal and/or the deposition of a further metal-containing electrode material, such as titanium nitride, as the layer 162a. It should be appreciated that typically different types of transistors are to be provided in the device region 110a, such as P-channel transistors and N-channel transistors, which may typically include the incorporation of a different type of work function species, which may be accomplished by a corresponding deposition and patterning regime. If a corresponding patterning strategy is considered inappropriate for the electronic characteristics of an electrode structure to be formed above the active region 102b, the patterning and/or deposition strategy may be modified so as to provide a different type of electrode material 163b in addition or alternatively to the material 162a. For example, the material 163b may represent a combination of metal-containing electrode materials that may separately be provided for different types of transistors in other device areas. Consequently, if required, the electronic characteristics of the resulting layer stack above the active region 102b may be adjusted separately with respect to the characteristics of the layer stack formed above the active region 102a.

After providing the metal-containing electrode material 163, possibly in combination with the material 163b, the materials 164, 165 may be deposited on the basis of any well-established deposition recipes.

Figure 1E:
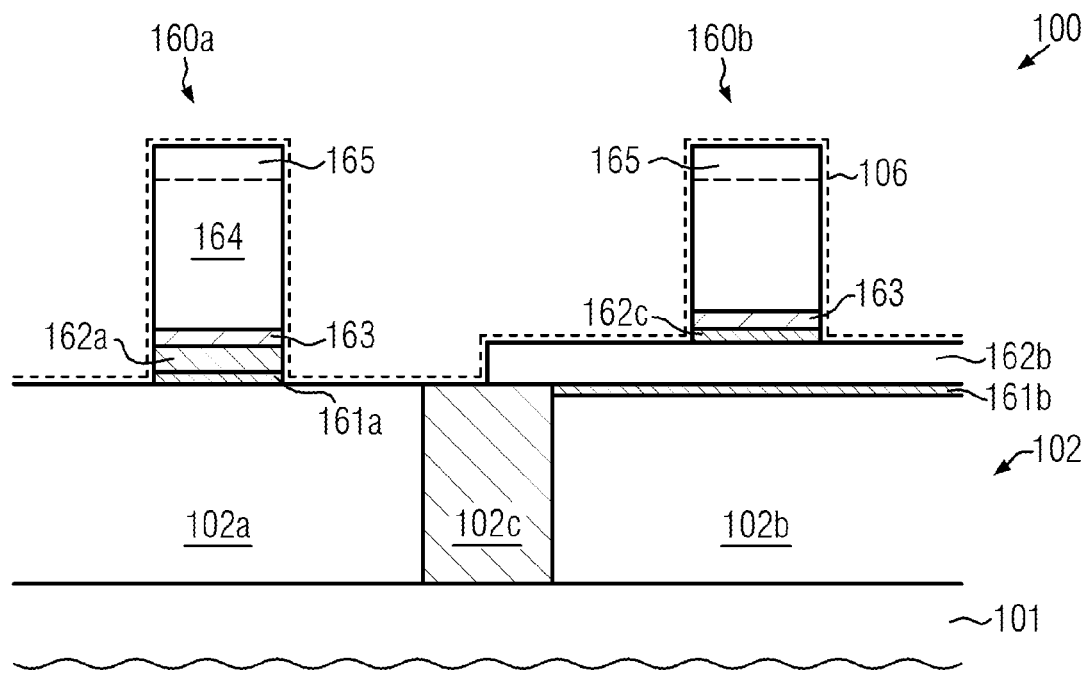

FIG. 1e schematically illustrates the semiconductor device 100 with a first electrode structure 160a, which represents, in some illustrative embodiments, a gate electrode structure of a transistor still to be formed in and above the active region 102a. Similarly, a second electrode structure 160b may be formed above the active region 102b and may represent, according to one illustrative embodiment, a gate electrode structure of a ferroelectric transistor to be formed in and above the active region 102b. In this manufacturing stage, the electrode structure 160b may not be completely patterned, since the layers 162b, 161b may still cover the entire active region 102b.

The layer stack as shown in FIG. 1d may be patterned in accordance with any appropriate patterning strategy, for instance by applying sophisticated lithography techniques, in order to pattern the one or more sacrificial layers 165 (FIG. 1d), which may then be used as a hard mask for transferring the desired lateral dimensions into the underlying material layers. To this end, any well-established techniques may be applied, for instance etching the electrode material 164 by using highly efficient and well-established plasma-assisted etch recipes. Furthermore, the metal-containing electrode material 163 may be etched, followed by well-established etch recipes for etching through the material 162a, which are typically designed such that undue material erosion of the layer 163 is avoided. Finally, an exposed portion of the layer 161a may be removed in some illustrative embodiments, while, in other cases, the removal of the layer may be achieved in a later manufacturing stage. During the above-described patterning sequence, the layer 162b formed above the active region 102b may act as a control material for reliably controlling the etch process without unduly contributing to a lateral material removal in the layer 163 of the gate electrode structure 160b. To this end, in some illustrative embodiments, the process sequence used for patterning the electrode structure 160a may be stopped upon process criteria that are determined by the gate electrode structure 160a. Consequently, due to the appropriate adjustment of process parameters, for instance with respect to avoiding undue material loss in the layer 163 of the gate electrode structure 160a, also new material loss in the gate electrode structure 160b may be prevented.

In some illustrative embodiments, a liner 106, for instance comprised of silicon nitride and the like, may be formed by any appropriate deposition technique with an appropriate thickness, for instance in the range of 1 to several nanometers, in order to cover, in particular, exposed sidewall portions of the material 163 in the gate electrode structure 160b. In other cases, the further processing may be continued without depositing the liner material 106.

Figure 1F:
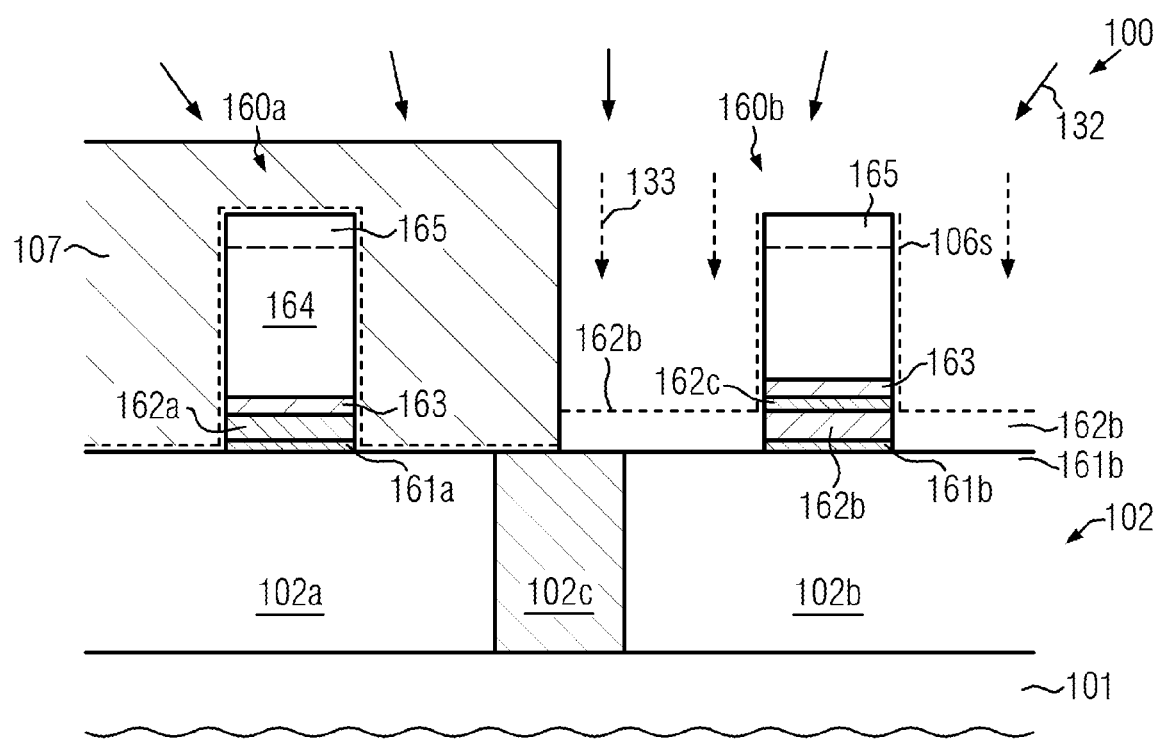

FIG. 1f schematically illustrates the semiconductor device 100 with a mask 107 formed above the active region 102a, thereby reliably covering exposed portions of the active region 102a and the gate electrode structure 160a. To this end, any appropriate hard mask material, such as silicon dioxide and the like, may be used, while, in other cases, polymer materials and the like may be applied, if these materials provide sufficient etch resistivity during a subsequent etch process for removing an exposed portion of the layer 162b. The patterning of the etch mask 107 may be accomplished on the basis of well-established lithography techniques, in which device areas without the material layer 162b, such as the device region 110a (FIG. 1a), may be appropriately covered with a resist material, which may be used for patterning the mask 107. In some illustrative embodiments, an etch sequence 132 may be applied so as to firstly remove a portion of the liner 106s, if provided, thereby obtaining respective spacers 106s on sidewalls of the gate electrode structure 160b, which, therefore, reliably cover the sidewalls of the electrode material 163 during the further process 132, in which the exposed portion of the material 162b may be removed. It should be appreciated that the material 162b may be in a non-amorphous state, for instance due to the previous deposition recipe and/or any preceding heat treatments, which may have been performed in order to adjust the overall characteristics of the electrode structures 160a, 160b. In this case, appropriate plasma-based etch recipes based on elevated temperatures may be applied so as to etch through the layer 162b, wherein the base layer 161b may act as a protective material in order to not unduly damage exposed portions of the active region 102b.

In other illustrative embodiments, a further implantation process 133 may be applied prior to actually removing the material 162b so as to significantly damage exposed material portions, however, without unduly affecting the material 162b in the gate electrode structure 160b. As already discussed above, also in this case, a substantially amorphous state may be established in the exposed portion of the layer 162b, thereby significantly enhancing the removal rate of well-established wet chemical etch recipes and plasma-assisted etch recipes. It should be appreciated that, in this manufacturing stage, the amorphization implantation 133 may not unduly affect the gate electrode structure 160b, since the sacrificial cap layer 165 may still be in place.

Thereafter, in some cases, the base layer 161B may be removed, while in other cases the mask 107 may be removed, while the base layer 161B may still protect, at least to a certain degree, underlying semiconductor areas of the region 102b. In some cases, the remaining liner 106 and the spacers 106s may be removed prior to continuing the processing of the device 100, while in other cases, the liner 106 may be preserved or patterned into corresponding spacers (not shown) in order to provide superior integrity of sensitive materials in the gate electrode structure 160a.

Figure 1G:
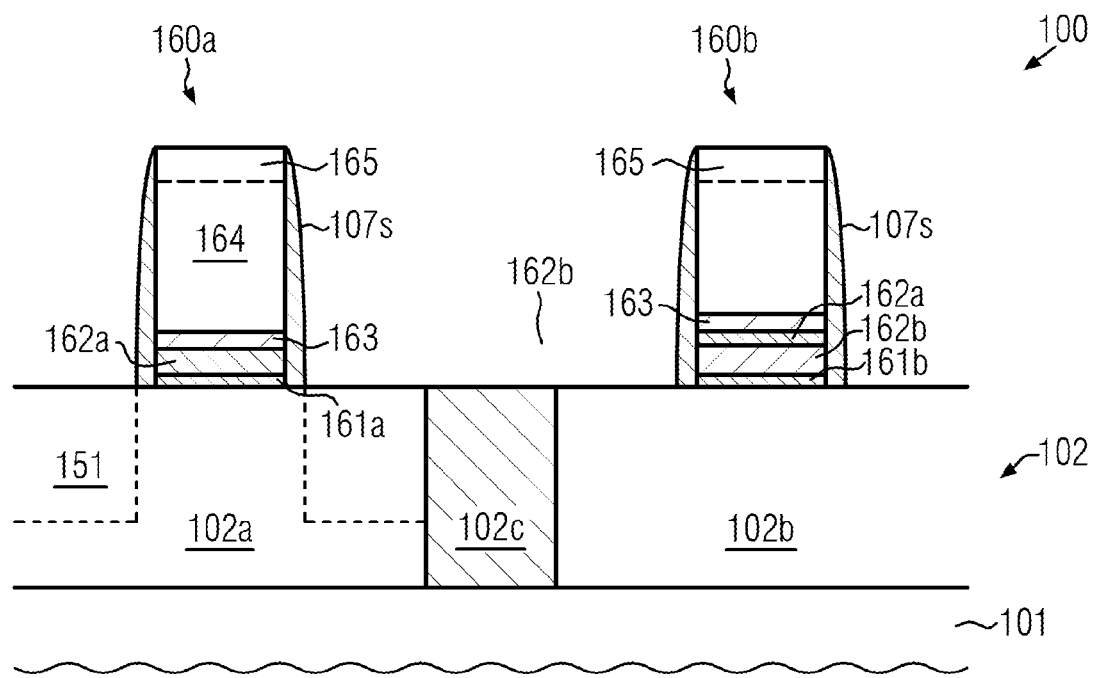

FIG. 1g schematically illustrates the semiconductor device 100 in a further advanced manufacturing stage. As shown, the gate electrode structure 160a may comprise a protective spacer 107s, which in turn may represent a portion of the liner 106 (FIG. 1e), possibly in combination with an additional liner material. Similarly, the electrode structure 160b may comprise the spacer 107s, possibly in combination with the spacer 106s (FIG. 1f), which may be accomplished on the basis of any well-established deposition and patterning regime. It should be appreciated that the encapsulation of sensitive gate materials in sophisticated transistor devices is a well-established procedure and may thus be applied to the gate electrode structure 160a and the electrode structure 160b. Moreover, in some illustrative embodiments, additional performance enhancing mechanisms may be implemented in one or both of the active regions 102a, 102b. For example, a strain-inducing semiconductor alloy 151, such as a silicon/germanium alloy, may be incorporated into the active region 102a, which may be accomplished on the basis of any well-established process strategies, for instance forming respective cavities therein, while covering other device areas, such as the active region 102b. Thereafter, an epitaxial growth technique may be applied in order to form the desired semiconductor material 151, while the deposition of this material may be suppressed in the active region 102b on the basis of an appropriate mask material. It should be appreciated, however, that any other performance enhancing mechanisms may be applied as is required for sophisticated transistors. Furthermore, any such performance enhancing mechanisms may also be implemented in the device to be formed in and above the active region 102b, if considered appropriate for the overall electronic characteristics of the ferroelectric circuit element under consideration. For example, if the ferroelectric field effect transistor is to be provided, it may be advantageous to additionally adjust the electronic characteristics thereof on the basis of the corresponding performance enhancing mechanism. For example, a corresponding strain-inducing material may also be incorporated into the active region 102b, if required for adjusting the overall transistor characteristics.

Thereafter, the processing may be continued by applying any well-established process strategies for completing the transistor structures, wherein, in some illustrative embodiments, these further processes may be applied commonly to the devices formed in and above the active region 102b and the active region 102b. In other cases, appropriate masking regimes may be applied so as to form resist masks and the like when, for instance, specifically adjusted process parameters may be required in and above the active region 102b.

Figure 1H:
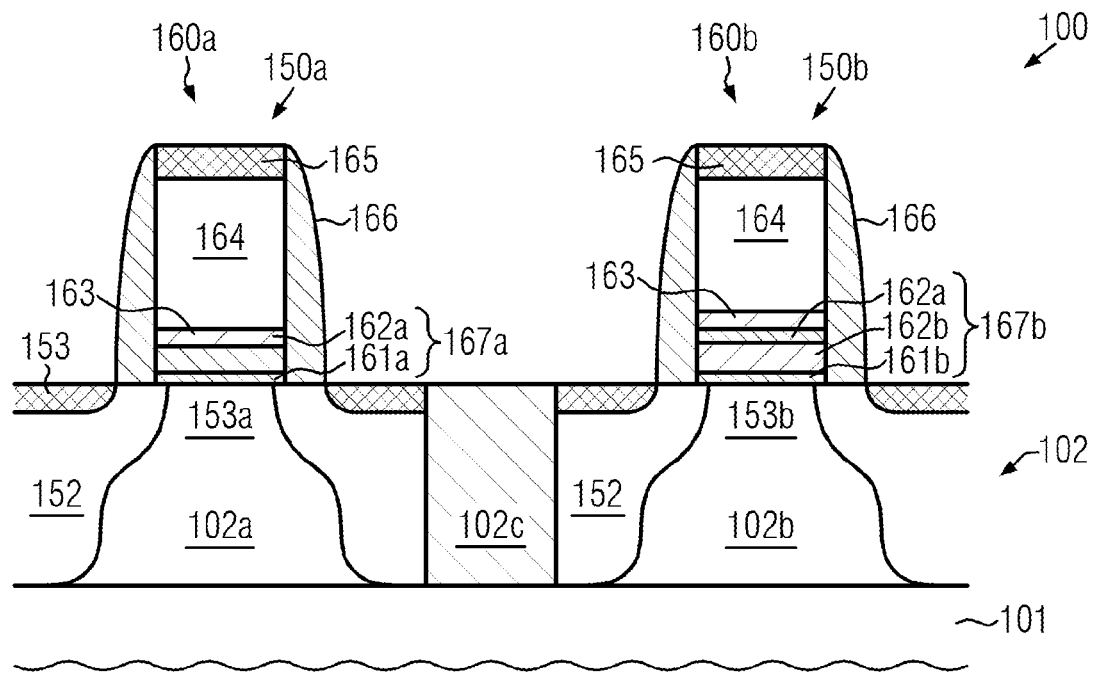

FIG. 1h schematically illustrates the semiconductor device 100 in a further advanced manufacturing stage. As illustrated, a transistor 150a may be formed in and above the active region 102a and may comprise the gate electrode structure 160a. Thus, the gate electrode structure 160a may comprise a gate dielectric layer 167a that is a combination of the base layer 161a, if provided, and the high-k dielectric layer 162a, followed by the electrode materials 163 and 164. Furthermore, a metal silicide 165 and a spacer structure 166 may be formed in the gate electrode structure 160a. As discussed above, the characteristics of the gate electrode structure 160a, such as the gate length, the work function and the like, may be selected so as to obtain performance characteristics of the transistor 150a as required, for instance in view of a fast switching behavior, current drive capability and the like, as is typically provided by fast sophisticated transistors for logic circuitry. Moreover, drain and source regions 152 may be formed in combination with metal silicide regions 153 in the active region 102a, wherein also specific strain conditions may be present in a channel region 153a, if required.

Similarly, a ferroelectric circuit element 150b, which in one illustrative embodiment represents a ferroelectric transistor, may comprise the gate electrode structure 160b, wherein a corresponding gate dielectric layer 167b may be comprised of the materials 161b, 162b, 162a, wherein, in particular, the layer 162b may impart ferroelectric characteristics to the gate electrode structure 160b. Moreover, the materials 163, possibly in combination with any additional metal-containing electrode material, as previously discussed, and 164 may act as efficient electrode materials in combination with the metal silicide 165. Furthermore, the spacer structure 166 may be provided. Hence, basically the gate electrode structure 160b may have the same configuration as the gate electrode structure 160a except for the ferroelectric behavior and possibly except for other lateral dimensions, for instance in terms of gate length and gate width. Similarly, the device 150b may comprise drain and source regions 152 in combination with the metal silicide regions 153, while a length and strain conditions of a channel region 153b may differ from the corresponding characteristics of the transistor 150a.

As discussed above, the process strategy for completing the transistor configuration as shown in FIG. 1h may be commonly applied to the transistors 150a, 150b, wherein, if required, corresponding different process parameters may be established by applying appropriate masking regimes. In the embodiment shown, the various components may have been formed in a common process sequence so that the drain and source regions may have similar characteristics with respect to dopant profile, if the devices 150a, 150b are of the same conductivity type. On the other hand, the transistor 150b may exhibit a pronounced difference with respect to its current drive capability depending on the polarization state established in the gate electrode structure 160b by applying an appropriate electrical field, as discussed above. Consequently, in this case, the transistor 150b has two distinguishable operational behaviors that may be considered as two different logic states, while the application of an appropriate electrical field and thus voltage across the gate electrode structure 160b may allow the adjustment of the desired polarization state and thus operational behavior of the transistor 150b. Hence, this transistor may be efficiently used as a non-volatile storage device, which may thus be provided with reduced area consumption and without any undue process modifications. Therefore, the superior characteristics of ferroelectric transistors, such as fast read and write times and the like, may be provided together with superior performance characteristics of sophisticated transistors comprising a high-k metal gate electrode structure.

Figure 2A:
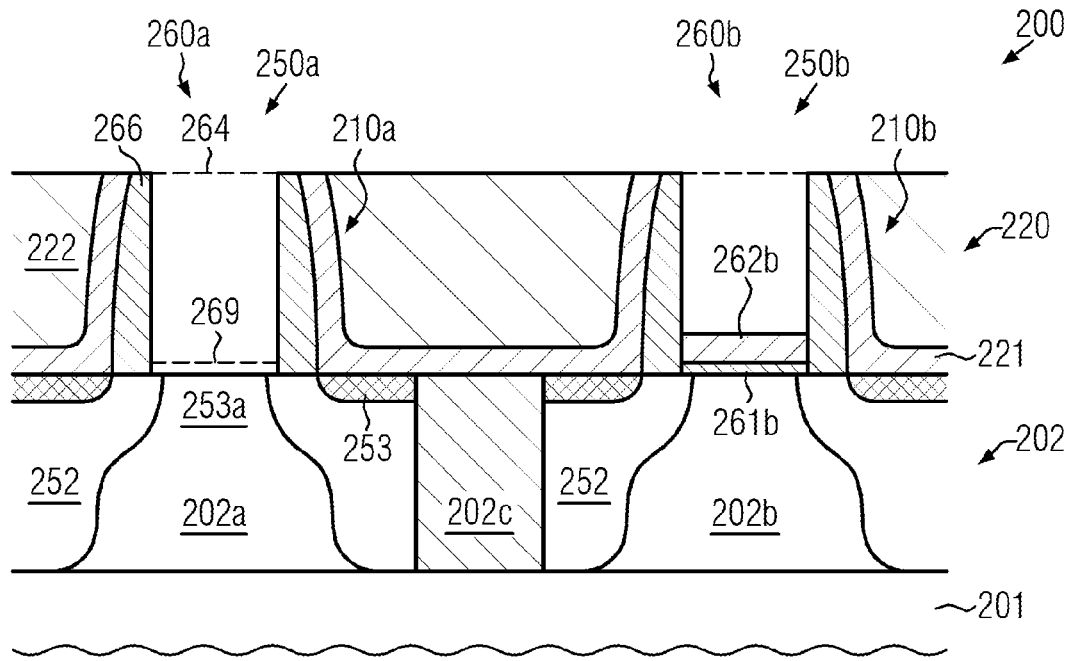
FIGS. 2*a*-2*b* schematically illustrate cross-sectional views of a semiconductor device when forming a fast transistor in combination with a ferroelectric transistor on the basis of a high-k dielectric material by using a replacement gate approach, according to further illustrative embodiments.
Figure 2B:
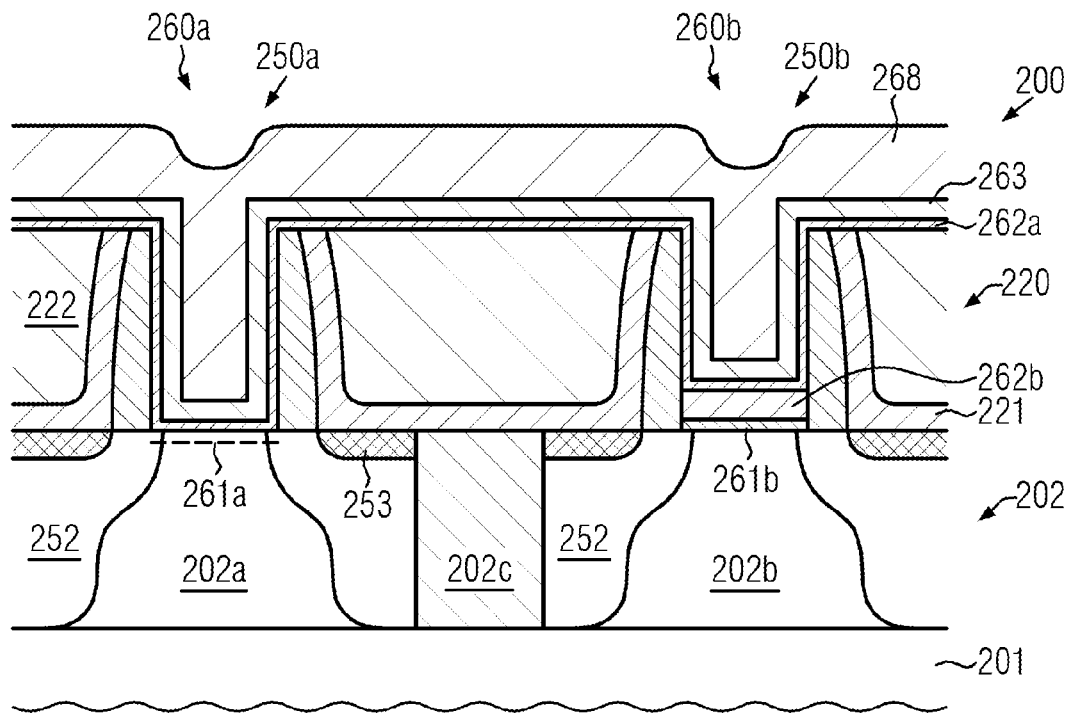

With reference to FIGS. 2a and 2b, further illustrative embodiments will now be described in more detail, wherein the final configuration of gate electrode structures may be completed after completing the basic transistor configuration by applying a so-called replacement gate approach.

FIG. 2a schematically illustrates a cross-sectional view of a semiconductor device 200 comprising a substrate 201, above which may be formed a semiconductor layer 202, which in turn may comprise a plurality of active regions 202a, 202b provided in corresponding device regions 210a, 210b. The regions 210a, 210b and the active regions 202a, 202b may be laterally delineated by an isolation structure 202c. With respect to these components, the same criteria may apply as previously discussed with reference to the semiconductor device 100.

In the manufacturing stage shown, a transistor 250a may comprise drain and source regions 252, possibly in combination with metal silicide regions 253, formed in the active region 202a. Similarly, a second transistor 250B may comprise drain and source regions 252 formed in the active region 202b. Furthermore, the transistor 250a may comprise a gate electrode structure 260a, wherein corresponding materials 264, 269 may be removed. Thus, in the manufacturing stage shown, the gate electrode structure 260a may comprise an opening or trench laterally delineated by a sidewall spacer structure 266, which in turn is embedded in a contact level 220, which may comprise appropriate dielectric materials, such as a layer 221, for instance in the form of silicon nitride, and the layer 222, for instance provided in the form of silicon dioxide and the like.

On the other hand, a transistor 250b may comprise a gate electrode structure 260b, in which a corresponding trench or opening may be laterally delineated by the spacer structure 266, while the bottom of the opening may be formed by a high-k dielectric material 262b, which represents a ferroelectric hafnium-based material, as is also previously discussed with reference to the semiconductor device 100. Furthermore, a dielectric base layer 261b may be formed below the high-k dielectric layer 262b.

The device 200 as shown in FIG. 2a may be formed on the basis of the following processes. The active regions 202a, 202b and the isolation structure 202c may be formed in accordance with process strategies as are also discussed above with reference to the device 100. Thereafter, the layers 261b, 262b may be formed in accordance with any appropriate process strategy, and the patterning of these layers may be accomplished, as is also described above with reference to the device 100. It should be appreciated that the base layer 269 may be formed in a separate process step after the patterning of the layer 262b, while, in other cases, the material 269 may basically be a portion of the base layer 261b, which may be preserved in the active region 202a. Thereafter, the further processing may be continued by patterning the gate electrode structures 260a, 260b as is discussed above and by completing the basic transistor configuration upon forming the drain and source regions 252. If required, metal silicide 253 may be formed, while in other cases, the dielectric materials of the contact level 220 may directly be formed on exposed portions of the active regions. After appropriately planarizing the resulting structure, the electrode or placeholder material 264 may be removed on the basis of well-established etch recipes, wherein the materials 269 and 262b may act as efficient etch stop layers. Thereafter, the layer 269 may be removed in order to expose a portion of the active region 202a so as to form thereon, if required, an appropriate base dielectric material, such as silicon dioxide, silicon nitride, any combination thereof and the like. It should be appreciated that, if required, the material 262b may be masked during a corresponding process, if interaction with a corresponding process ambient is considered inappropriate. In other cases, the material 264 of the gate electrode structure 260b may be removed separately so as to avoid exposure of the material 262b when forming the opening in the gate electrode structure 260a.

FIG. 2b schematically illustrates the device 200 in a further advanced manufacturing stage. As illustrated, a base layer 261a may be formed, if required, in the gate electrode structure 260a and a high-k dielectric layer 262a may be formed on sidewalls and on or above the active region 202a with appropriate material characteristics and a thickness so as to comply with the requirements of the transistor 250a. The layer 262a may comprise hafnium, possibly in combination with other high-k dielectric materials, depending on the overall device requirements. Furthermore, at least one metal-containing electrode layer 263 may be provided so as to adjust an appropriate work function for the gate electrode structure 260a, followed by at least one highly conductive electrode metal 268, such as aluminum, an aluminum alloy and the like. In the embodiment shown, the material layers 262a, 263 and 268 may also be provided in the gate electrode structure 260b, wherein, if required, additional adaptation of electronic characteristics may be achieved, for instance by varying the number and type of material layers, if considered appropriate. It should be appreciated that typically different work function metals, such as the layer 263, may have to be provided in different types of transistors, which may require respective deposition and patterning strategies. Consequently, a corresponding process sequence may be appropriately modified so as to provide a desired type and number of work function metals in the gate electrode structure 260b, if the same sequence of materials in the gate electrode structures 260a, 260b is considered inappropriate.

Thereafter, any excess material may be removed by appropriate planarization techniques, thereby providing the gate electrode structures 260a, 260b as electrically isolated structures. Consequently, also in this case, the gate electrode structure 260b may be provided with dielectric behavior due to the provision of the layer 262b substantially without affecting the replacement gate approach for providing a sophisticated high-k metal gate electrode structure for the transistor 250a.

In the embodiments described with reference to FIGS. 2a and 2b, the high-k dielectric material based on hafnium for the gate electrode structure 260a may be provided in a late manufacturing stage during the replacement gate approach, while in other cases this material may be provided in an early manufacturing stage, as described above with reference to the device 100, while highly conductive electrode metals, such as the material 268, may be deposited during the replacement gate approach. Also in this case, the above-described process sequence may be advantageously applied for obtaining sophisticated gate electrode structures while additionally providing a ferroelectric circuit component.

As a result, the present disclosure provides manufacturing techniques and semiconductor devices in which ferroelectric circuit elements may be efficiently fabricated together with sophisticated transistors including a high-k metal gate electrode structure. To this end, the ferroelectric circuit element and the sophisticated gate electrode structure may be formed by using at least one dielectric material comprising hafnium, wherein an efficient patterning of the ferroelectric material layer may be achieved without interfering with well-established process strategies for implementing a high-k metal gate electrode structure. In this manner, non-volatile storage devices may be incorporated in sophisticated circuit designs without undue modification of the overall process flow. Moreover, the ferroelectric circuit element may be provided as a transistor whose gate electrode structure may be formed together with the sophisticated gate electrode structure of a fast transistor, while in other cases an electrode structure may be formed as a component of a capacitor, which may be used as a non-volatile component in combination with an appropriate transistor element. In this case, the gate electrode structure of the sophisticated transistor and the electrode structure of the capacitor may be formed in accordance with a process strategy as described above, while corresponding modifications may be implemented with respect to providing the capacitor electrode in the active region according to well-established capacitor configurations.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a first high-k dielectric layer above a first active region and a second active region so as to serve as a ferroelectric layer;
    removing said first high-k dielectric layer from above said first active region and preserving said first high-k dielectric layer above said second active region, wherein removing said first high-k dielectric layer from above said first active region comprises establishing an amorphous state of said first high-k dielectric layer and performing an etch process while said first high-k dielectric layer is in the amorphous state; and
    forming a first electrode structure above said first active region and a second electrode structure above said second active region.

2. The method of claim 1, wherein establishing an amorphous state of said first high-k dielectric layer comprises performing an implantation process.

3. The method of claim 1, further comprising forming a second high-k dielectric layer above at least a portion of said first active region and above at least a portion of said first high-k dielectric layer.

4. The method of claim 3, wherein said first high-k dielectric layer and said second high-k dielectric layer comprise hafnium.

5. The method of claim 3, wherein said first and second electrode structures are formed after forming said second high-k dielectric layer.

6. The method of claim 5, wherein forming said first and second electrode structures comprises patterning a layer stack formed above said first and second active regions by using said first high-k dielectric material as a stop material above said second active region, and removing an exposed portion of said first high-k dielectric layer while masking said first electrode structure.

7. The method of claim 6, wherein forming said first and second electrode structures further comprises forming a protective spacer on sidewalls of said second electrode structure prior to removing said exposed portion of said first high-k dielectric layer.

8. The method of claim 3, wherein said second high-k dielectric layer is formed after forming said first and second electrode structures.

9. A method, comprising:
forming a first gate electrode structure above a first active region, said first gate electrode structure comprising a first hafnium-based dielectric material of a first thickness;
forming a second gate electrode structure above a second active region, said second gate electrode structure comprising a second hafnium-based dielectric material having a ferroelectric behavior, said second hafnium-based dielectric material having a second thickness that is greater than said first thickness, wherein forming the second gate electrode structure comprises forming said second hafnium-based dielectric material above said first and second active regions and removing said second hafnium-based dielectric material selectively from above said first active region; and
forming drain and source regions in said first and second active regions.

10. The method of claim 9, wherein said second gate electrode structure further comprises said first hafnium-based dielectric material positioned above said second hafnium-based dielectric material.

11. A method, comprising:
forming a first hafnium-based dielectric material having a ferroelectric behavior above first and second active regions, said first hafnium-based dielectric material having a first thickness;
selectively removing said first hafnium-based dielectric material from above said first active region;
forming a second hafnium-based dielectric material above said first and second active regions, said second hafnium-based dielectric material having a second thickness that is less than said first thickness;
forming a first gate electrode structure above said first active region, said first gate electrode structure comprising said second hafnium-based dielectric material; and
forming a second gate electrode structure above said second active region, said second gate electrode structure comprising said first hafnium-based dielectric material and said second hafnium-based dielectric material.

12. The method of claim 11, further comprising forming drain and source regions in said first and second active regions.

13. The method of claim 11, wherein selectively removing said first hafnium-based dielectric material from above said first active region comprises performing an implantation process so as to establish an amorphous state for said first hafnium-based dielectric material and performing an etch process while said first hafnium-based dielectric material is in said amorphous state.

14. The method of claim 11, wherein said first and second gate electrode structures are formed after forming said second hafnium-based dielectric material.

15. The method of claim 11, wherein forming said first and second gate electrode structures comprises patterning a layer stack formed above said first and second active regions by using said first hafnium-based dielectric material as a stop material above said second active region, and removing an exposed portion of said first hafnium-based dielectric material positioned above said second active region while masking said first gate electrode structure.

16. The method of claim 11, wherein said second hafnium-based dielectric material is formed after forming said first and second gate electrode structures.

17. The method of claim 1, wherein the first high-k dielectric layer comprises hafnium and silicon.

18. The method of claim 1, wherein the first high-k dielectric layer comprises hafnium oxide and silicon dioxide.

19. The method of claim 9, wherein the second hafnium-based dielectric material comprises hafnium and silicon.

20. The method of claim 9, wherein the second hafnium-based dielectric material comprises hafnium oxide and silicon dioxide.

21. The method of claim 11, wherein the first hafnium-based dielectric material comprises hafnium and silicon.

22. The method of claim 11, wherein the first hafnium-based dielectric material comprises hafnium oxide and silicon dioxide.

23. A method, comprising:
forming a first high-k dielectric layer above a first active region and a second active region so as to serve as a ferroelectric layer;
removing said first high-k dielectric layer from above said first active region and preserving said first high-k dielectric layer above said second active region;
forming a second high-k dielectric layer above at least a portion of said first active region and above at least a portion of said first high-k dielectric layer; and
after forming said second high-k dielectric layer, forming a first electrode structure above said first active region and a second electrode structure above said second active region, wherein forming said first and second electrode structures comprises patterning a layer stack formed above said first and second active regions by using said first high-k dielectric material as a stop material above said second active region, and removing an exposed portion of said first high-k dielectric layer while masking said first electrode structure.

24. The method of claim 23, wherein said first high-k dielectric layer and said second high-k dielectric layer comprise hafnium.

25. The method of claim 23, wherein the first high-k dielectric layer comprises hafnium and silicon.

26. The method of claim 23, wherein the first high-k dielectric layer comprises hafnium oxide and silicon dioxide.

27. A method, comprising:
forming a first high-k dielectric layer above a first active region and a second active region so as to serve as a ferroelectric layer;
removing said first high-k dielectric layer from above said first active region and preserving said first high-k dielectric layer above said second active region; and forming a first electrode structure above said first active region and a second electrode structure above said second active region; and after forming the first and second electrode structures, forming a second high-k dielectric layer above at least a portion of said first active region and above at least a portion of said first high-k dielectric layer.

28. The method of claim 27, wherein said first high-k dielectric layer and said second high-k dielectric layer comprise hafnium.

29. The method of claim 27, wherein the first high-k dielectric layer comprises hafnium and silicon.

30. The method of claim 27, wherein the first high-k dielectric layer comprises hafnium oxide and silicon dioxide.

31. A method, comprising:
  forming a first high-k dielectric layer above a first active region and a second active region so as to serve as a ferroelectric layer, the first high-k dielectric layer comprising silicon;
  removing said first high-k dielectric layer from above said first active region and preserving said first high-k dielectric layer above said second active region;
  after removing said first high-k dielectric layer from above said first active region, forming a second high-k dielectric layer above at least a portion of said first active region and above at least a portion of said first high-k dielectric layer, wherein said second high k dielectric layer has a different material composition than that of said first high k dielectric; and
  forming a first electrode structure above said first active region and a second electrode structure above said second active region.

32. The method of claim 31, wherein said first high-k dielectric layer and said second high-k dielectric layer comprise hafnium.

33. The method of claim 31, wherein said first and second electrode structures are formed after forming said second high-k dielectric layer.

34. The method of claim 31, wherein the first high-k dielectric layer comprises hafnium and silicon.

35. The method of claim 31, wherein the first high-k dielectric layer comprises hafnium oxide and silicon dioxide.

* * * * *